(12) United States Patent
Kim et al.

(10) Patent No.: US 11,415,891 B2
(45) Date of Patent: Aug. 16, 2022

(54) EXTREME ULTRAVIOLET LIGHT SOURCE SYSTEM

(71) Applicant: Samsung Electronics Co., Ltd., Suwon-si (KR)

(72) Inventors: Sunghyup Kim, Hwaseong-si (KR); Myeongjun Gil, Seoul (KR); Yebin Nam, Suwon-si (KR); Injae Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/221,388

(22) Filed: Apr. 2, 2021

(65) Prior Publication Data

US 2022/0075271 A1 Mar. 10, 2022

(30) Foreign Application Priority Data

Sep. 4, 2020 (KR) .................. 10-2020-0112897

(51) Int. Cl.
*G03F 7/20* (2006.01)
*H05G 2/00* (2006.01)

(52) U.S. Cl.
CPC .......... *G03F 7/70033* (2013.01); *G03F 7/702* (2013.01); *H05G 2/005* (2013.01); *H05G 2/008* (2013.01)

(58) Field of Classification Search
CPC ..... G03F 7/70033; G03F 7/702; H05G 2/005; H05G 2/008
See application file for complete search history.

(56) References Cited

U.S. PATENT DOCUMENTS

| 8,847,183 | B2 | 9/2014 | Partlo et al. |
| 10,034,362 | B2 | 7/2018 | Kuritsyn et al. |
| 10,162,277 | B2 | 12/2018 | Chien et al. |
| 10,401,602 | B2 | 9/2019 | Kim et al. |
| 10,656,539 | B2 | 5/2020 | Wu et al. |
| 2020/0037427 | A1 | 1/2020 | Yang et al. |
| 2020/0057364 | A1 | 2/2020 | Liao et al. |
| 2020/0057389 | A1 | 2/2020 | Lin et al. |
| 2020/0146136 | A1 | 5/2020 | Yu et al. |

FOREIGN PATENT DOCUMENTS

KR 10-2020-0031499 A 3/2020

*Primary Examiner* — Nicole M Ippolito
*Assistant Examiner* — Hanway Chang
(74) *Attorney, Agent, or Firm* — Muir Patent Law, PLLC

(57) ABSTRACT

An extreme ultraviolet light source system includes a chamber configured to maintain a pressure of an inner space thereof at a first pressure, a droplet supply unit disposed in the chamber and configured to discharge a droplet on a first path, a light source configured to emit a light for generating plasma by irradiating a laser light to the droplet at a focal point on the first path, and a suction unit disposed on the first path so as to face the droplet supply unit in the chamber and configured to suction debris of the droplet irradiated with the laser light at a second pressure, lower than the first pressure, wherein the suction unit includes a nozzle protruding from a side wall of the chamber toward the focal point, and an end of the nozzle is closer to the focal point than it is to the side wall of the chamber.

20 Claims, 9 Drawing Sheets

I - I'

EXTREME ULTRAVIOLET LIGHT SOURCE SYSTEM

CROSS-REFERENCE TO RELATED APPLICATION(S)

This application claims benefit of priority to Korean Patent Application No. 10-2020-0112897 filed on Sep. 4, 2020 in the Korean Intellectual Property Office, the disclosure of which is incorporated herein by reference in its entirety.

BACKGROUND

The present inventive concept relates to an extreme ultraviolet light source system.

Recently, for finely fabricating semiconductor devices, a lithography process using extreme ultraviolet light has been proposed. A critical dimension of a circuit formed by the lithography process depends on a wavelength of a light source. Therefore, it is important to shorten the wavelength of light source used in the lithography process in order to more finely fabricate semiconductor devices. Extreme ultraviolet light has a wavelength of about 1 nm to 100 nm. As extreme ultraviolet light has a high absorption rate in all materials, it is difficult to use in a transmission-type optical system such as a lens, and it is commonly used in a reflection-type optical system. In order to generate light from the light source of the ultraviolet light source, a laser produced plasma (LPP) scheme, based on laser irradiation, is commonly used.

SUMMARY

An aspect of the present disclosure is to provide an extreme light source system preventing an internal space of a chamber or a mask from being contaminated by debris of a droplet.

According to an example embodiment, an extreme ultraviolet light source system includes a chamber configured to maintain a pressure of an inner space thereof at a first pressure, a droplet supply unit disposed in the chamber and configured to discharge a droplet on a first path, a light source configured to emit a light for generating plasma by irradiating a laser light to the droplet at a focal point on the first path, and a suction unit disposed on the first path so as to face the droplet supply unit in the chamber and configured to suction debris of the droplet irradiated with the laser light at a second pressure, lower than the first pressure, wherein the suction unit includes a nozzle protruding from a side wall of the chamber toward the focal point, and an end of the nozzle is closer to the focal point than it is to the side wall of the chamber.

According to an example embodiment, an extreme ultraviolet light source system includes a chamber, a droplet supply unit disposed in the chamber and arranged to discharge a droplet along a first path crossing an internal space of the chamber, a laser light source configured to irradiate a laser to the droplet at a focal point on the first path, and a suction unit disposed in the chamber so as to face the droplet supply unit on the first path, having an end spaced apart from the focal point by 1.4 mm to 20 mm, and configured to suction debris of the droplet at a pressure lower than a pressure of the chamber.

According to an example embodiment, an extreme ultraviolet light source system includes a chamber comprising a condensing mirror, a droplet supply unit disposed on a first side wall of the chamber and arranged to discharge a droplet along a first path, the first path extending above the condensing mirror, a laser light source configured to irradiate a laser to the droplet at a first focal point on the first path, and a suction unit including a nozzle disposed on a second side wall of the chamber opposite the first side wall, so as to face the droplet supply unit on the first path, the nozzle protruding to be adjacent to the first focal point, and configured to suction debris of the droplet at a differential pressure at least 0.4 torr lower than a pressure of the chamber.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various example embodiments will be described with reference to the accompanying drawings.

Figure 1:
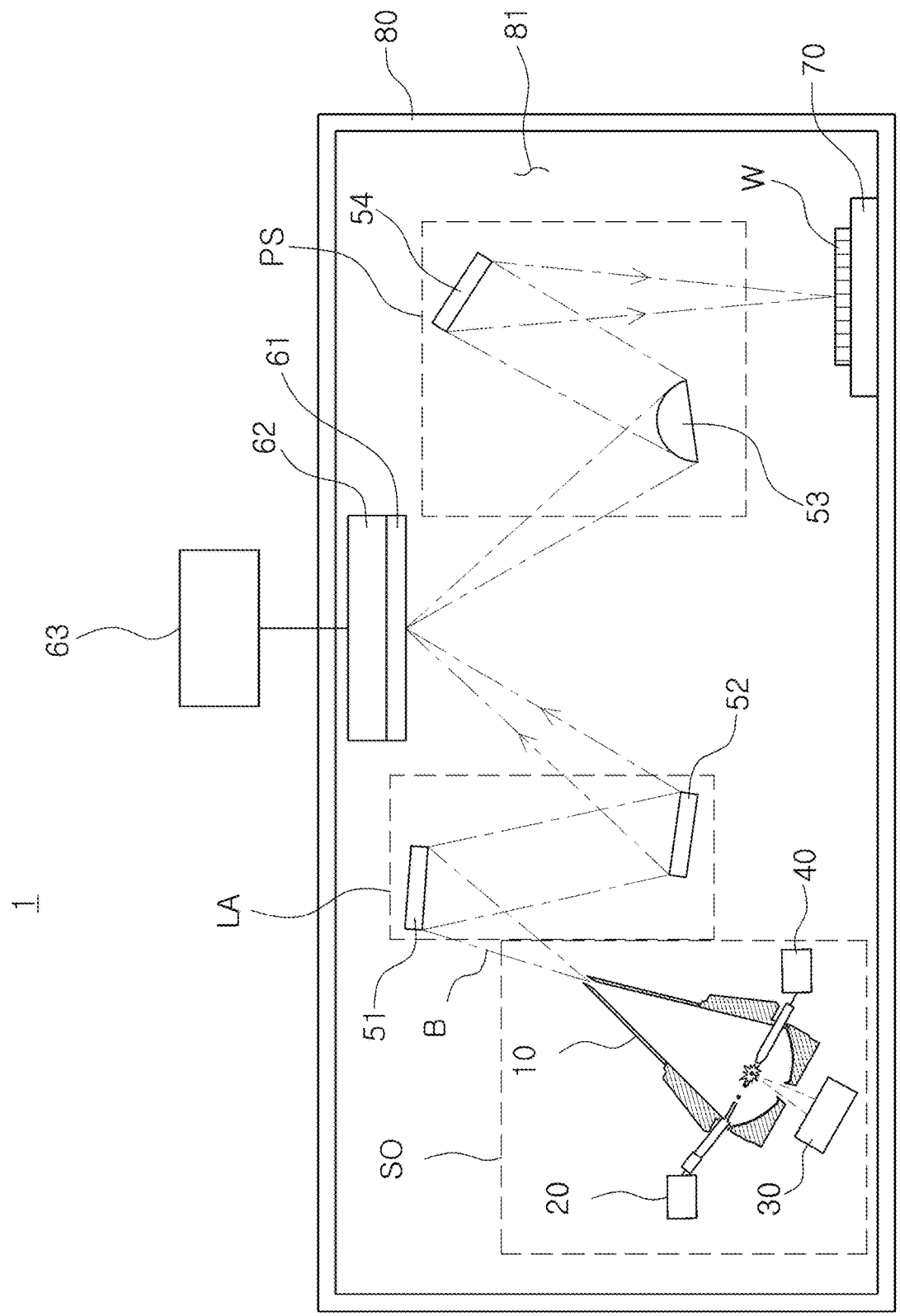
FIG. 1 is a diagram schematically illustrating extreme ultraviolet exposure equipment employing an extreme ultraviolet light source system according to an example embodiment of the present disclosure.
Figure 2:
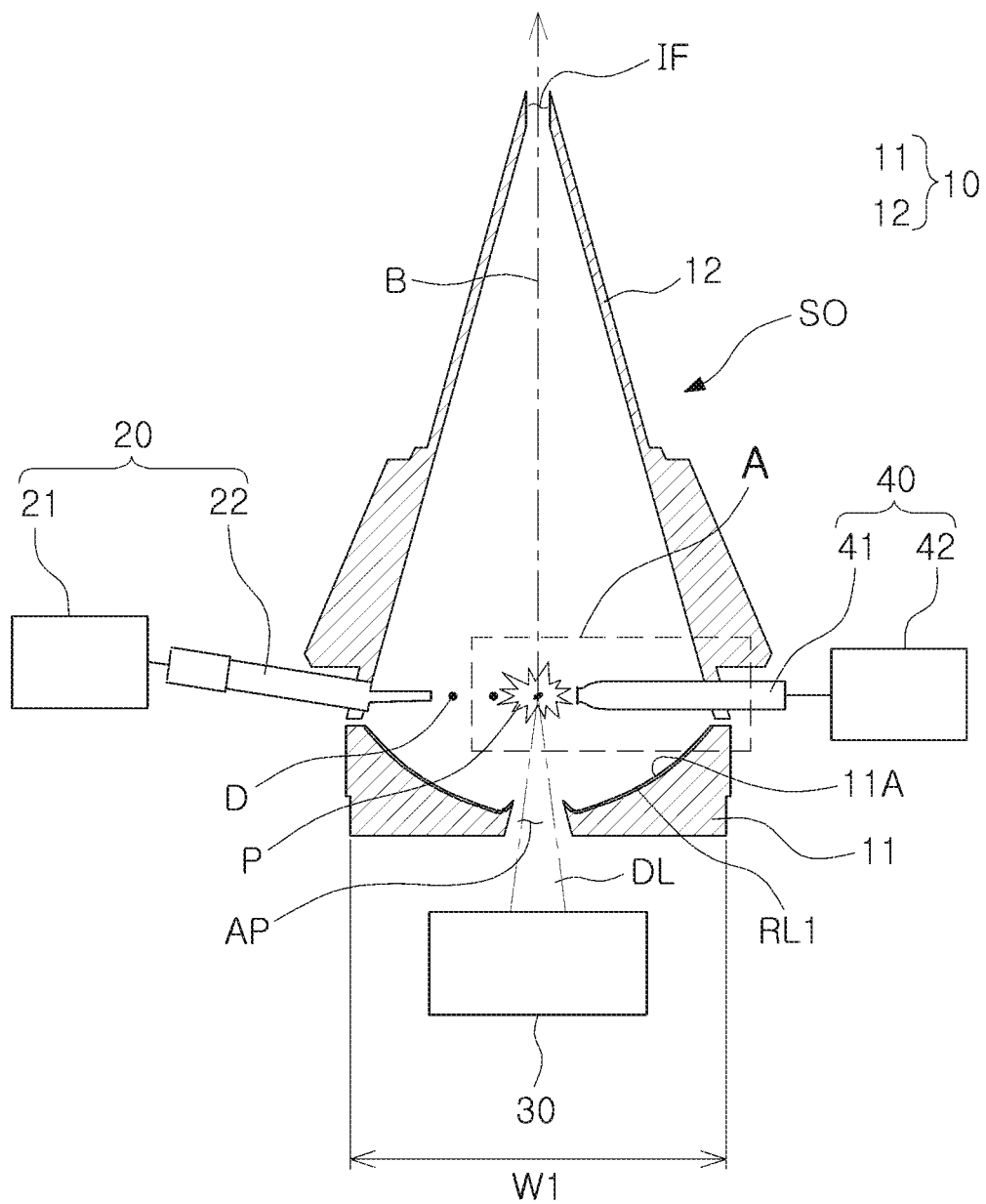
FIG. 2 is a side cross-sectional view schematically illustrating an extreme ultraviolet light source system according to an example embodiment.
Figure 3:
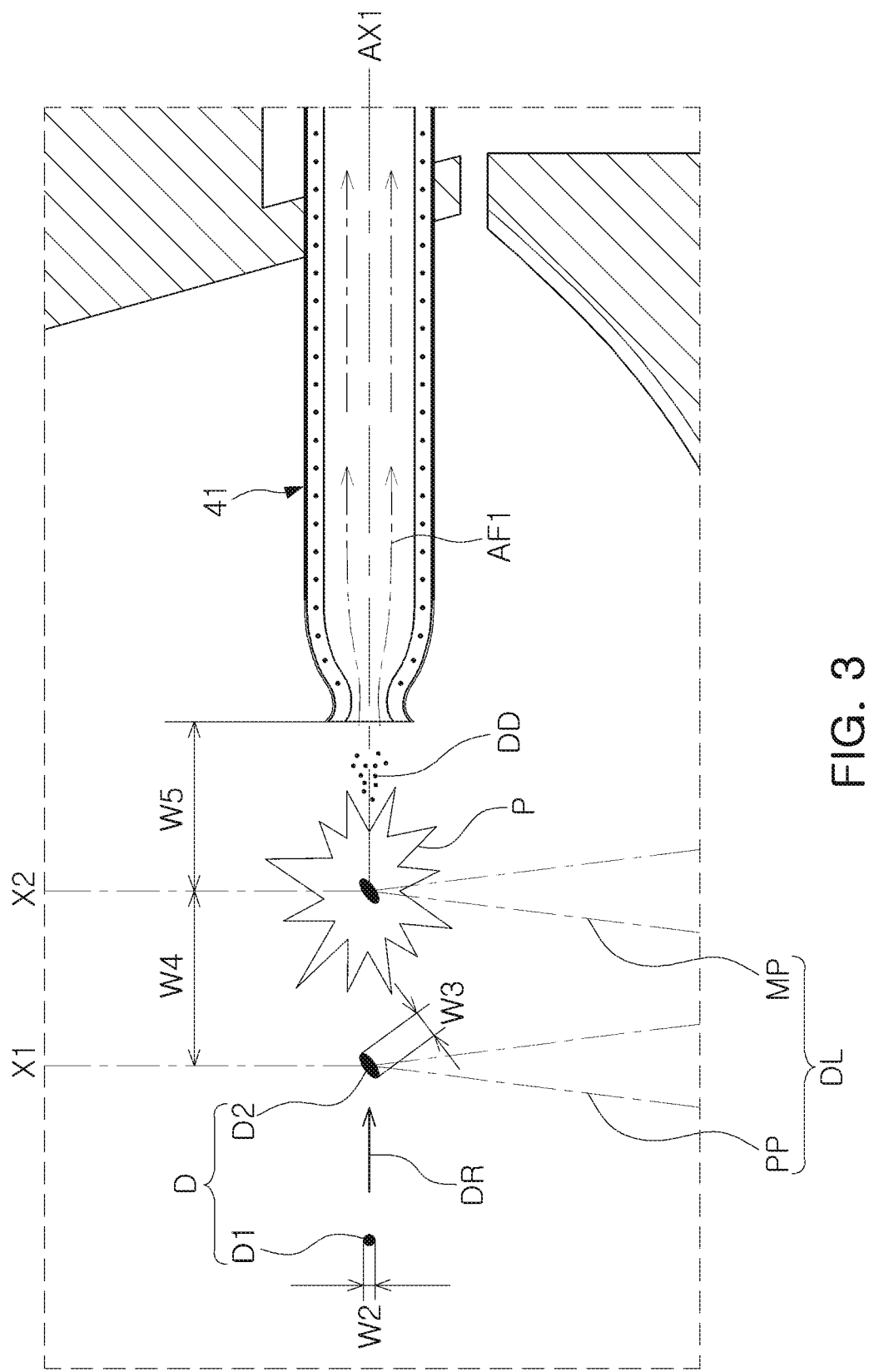
FIG. 3 is an enlarged view of "A" of FIG. 2, according to an example embodiment.

FIG. 1 is a diagram schematically illustrating extreme ultraviolet exposure equipment employing an extreme ultraviolet light source system according to an example embodiment of the present disclosure, and FIG. 2 is a side cross-sectional view schematically illustrating an extreme ultraviolet light source system according to an example embodiment. FIG. 3 is an enlarged view of "A" of FIG. 2 according to an example embodiment.

Referring to FIG. 1, extreme ultraviolet exposure equipment 1 according to an example embodiment of the present disclosure may include an exposure chamber 80, an extreme ultraviolet light source system SO, a lithographic apparatus LA, a projection system PS, an upper electrostatic chuck (ESC) 62, and a lower ESC 70.

The exposure chamber 80 may have an inner space 81, and the extreme ultraviolet light source system SO, the lithographic apparatus LA, the projection system PS, the upper ESC 62, and the lower ESC 70 may be disposed in the inner space 81. However, some components may be disposed outside the exposure chamber 80. For example, the extreme ultraviolet light source system SO may be partially disposed outside the exposure chamber 80. A mask 61 may be loaded onto or unloaded from the upper ESC 62 by an electrostatic force formed by power applied from a power supply unit 63, and a substrate W such as a semiconductor wafer may be loaded onto or unloaded from the lower ESC 70. The inner space 81 of the exposure chamber 80 may be in a low-pressure state of about 5 Pa or less or in a vacuum state to prevent extreme ultraviolet light B generated by the extreme ultraviolet light source system SO from being absorbed into gas.

Referring to FIGS. 2 and 3, the extreme ultraviolet light source system SO may produce extreme ultraviolet light B having a wavelength of less than about 100 nm. The extreme ultraviolet light source system SO may be, for example, a plasma source. For example, the extreme ultraviolet light source system SO may be a laser-produced plasma (LPP) light source which produces plasma P by irradiating a laser light DL oscillated from a light source unit 30 (e.g., a light generator) to a droplet D formed of any one of tin (Sn), lithium (Li) and xenon (Xe). Alternately, the light source system SO according to an example embodiment may employ a master oscillator power amplifier. For example, the light source unit 30 may use a seed laser to generate a pre-pulse PP and a main pulse MP, and expands the droplet D by irradiating the pre-pulse PP thereto, followed by using the plasma P generated by irradiating the main pulse 1\IP to the expanded droplet D to discharge an extreme ultraviolet light.

In the light source chamber 10 of the extreme ultraviolet light source system SO, droplets D supplied by the droplet supply unit 20 may collide with the laser light DL supplied by the light source unit 30 50000 or more times per second to generate the plasma. A condensing mirror 11A of the light source chamber 10 reflects some of the extreme ultraviolet light B emitted from the plasma (which is emitted in all directions) and concentrates the same to be directed forward so as to provide the extreme ultraviolet light B to the lithographic apparatus LA.

The lithographic apparatus LA may include multiple mirrors to irradiate the extreme ultraviolet light B emitted from the extreme ultraviolet light source system SO in a direction of the upper ESC 62. As the multiple mirrors included in the lithographic apparatus LA have an already known structure, only two mirrors 51 and 52 are illustrated for simplicity of the drawings and for convenience of description.

The projection system PS may include multiple mirrors to irradiate a pattern of the extreme ultraviolet light B reflected from the mask 61 attached to the upper ESC 62 to the substrate W disposed on the lower ESC 70, such that the pattern is exposed to a surface of the substrate W. Since the multiple mirrors included in the projection system PS have an already known structure, only two mirrors 53 and 54 are illustrated for simplicity of the drawings and for convenience of description.

Hereinafter, the extreme ultraviolet light source system SO will be described with reference to FIGS. 2 to 4.

Referring to FIG. 2, the extreme ultraviolet light source system SO may include a light source chamber 10, a droplet supply unit 20, a light source unit 30 and a suction unit 40.

According to some embodiments, the light source unit 30 is a driver light source, such as a laser, and the oscillated laser light DL is provided in the form of a pulse wave and includes a pre-pulse PP and a main pulse MP. The pre-pulse PP may improve conversion efficiency by increasing a surface area of the droplet D in advance before the main pulse MP is absorbed into and interacts with the droplet D. The conversion efficiency refers to a ratio of an output power of emitted extreme ultraviolet light B to an input power of laser light DL oscillated from the light source unit 30.

The pre-pulse PP is irradiated to a first focal point X1 of the light source chamber 10 and irradiated to the droplet D traveling on a first path DR to increase a surface area of the droplet D. Therefore, the pre-pulse PP of the laser light is focused at first focal point X1. The droplet D has a smaller diameter prior to the pre-pulse PP than after the pre-pulse PP, which is a laser pulse having a relatively low output. The droplet D is allowed to collide with the pre-pulse PP in advance to expand a droplet D1 having a spherical shape into a droplet D2 having a pancake shape (e.g., which may have a greater width and length in a horizontal direction than a height in a vertical direction), such that the main pulse MP and the droplet D accurately collide with each other.

The main pulse MP is irradiated to a second focal point X2 and is absorbed into the droplet D2 expanded into the pancake shape to form plasma P emitting the extreme ultraviolet.

Therefore, the main pulse MP of the laser is focused at second focal point X2.

The light source chamber 10 may include a lower body 11 collecting the generated extreme ultraviolet light B and an upper body 12 coupled to the lower body 11 and having a conical outer shape.

The condensing mirror 11A configured to direct the generated extreme ultraviolet light B toward the upper body 12 may be disposed in the lower body 11. A reflective layer RL1 for improving reflectivity of the extreme ultraviolet light B may be formed in the condensing mirror 11A. For example, the reflective layer RL1 may be formed of multiple thin layers on which molybdenum-silicon (Mo—Si) are alternately stacked. An optical aperture AP may be disposed at a central portion of the light source unit 30 to control an amount of the laser light DL oscillated from the light source unit 30 that reaches the light source chamber 10. In the case of an example embodiment, the lower body 11 may have a width W1 of about 600 mm.

The upper body 12 may be a cover having a conical shape, in which a width thereof is gradually reduced toward a top, and an intermediate focal point IF region for providing a path in which the generated extreme ultraviolet light B is emitted may be located at an end of the cone.

The droplet supply unit 20 for supplying droplets D may be disposed on one side of the upper body 12. The droplet supply unit 20 may include a droplet supply source 21 and a droplet discharge unit 22. The spherical droplet D1 may have a diameter of about 20 μm to 100 μm. In an example embodiment, the spherical droplet D1 may have a diameter of about Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The droplet supply source 21 may supply a target material for forming the droplet D. The target material may be formed of a material such as tin (Sn), lithium (Li) and xenon (Xe), and the droplet (D) may be in the form of a liquefied target material or the form in which a liquid material contains a solid particle of the target material.

The droplet D may be discharged through the droplet discharge unit 22 by pressing the target material stored in the droplet supply source 21. For example, the droplet supply source 21 and droplet discharge unit 22 may have a structure and operation such as described in U.S. Pat. No. 8,847,183, which is incorporated herein in its entirety by reference. The droplets D may be continuously discharged from the droplet discharge unit 22, for example, at a speed of about 20 m/s to 70 m/s and a time interval of about 20 μs between droplets. The droplet discharge unit 22 may be an elongated container, such as a tube or cannister, having an inlet connected to the droplet supply source 21 and an outlet within the light source chamber 10. The droplet D is discharged from the droplet discharge unit 22 and then proceeds along the first path DR, followed by being irradiated by the pre-pulse PP and the main pulse MP at the positions of the first and second focal points X1 and X2. The second focal point X2 is also known as a primary focal point. However, the pre-pulse PP and main pulse MP are not necessarily irradiated to all of the droplets D discharged from the droplet discharge unit 22. For example, some of the droplets D may be suctioned into the suction unit 40 to be described while being irradiated only with the pre-pulse PP.

The spherical droplet D1 may be irradiated by the pre-pulse PP to expand into a pancake shape. When the pancake shaped droplet D2 is irradiated by the main pulse MP, the plasma P may then be emitted. The droplet D1 irradiated with the main pulse MP explodes and leaves debris DD. The debris DD may be formed of fine droplets, gas, or a mixture thereof. If the debris DD reaches a sidewall of the upper body 12, which may occur due to a strong upward fluid (or gas) flow inside the light source chamber 10, it may be attached to the sidewall of the upper body 12 to interfere with a flow of the fluid (or gas) inside the upper body 12. In addition, some of the debris DD attached to the sidewall of the upper body 12 may fall on the condensing mirror 11A, thereby deteriorating quality of the extreme ultraviolet light B. Further, the debris DD passing through the intermediate focal pointing IF region of the upper body 12 may be attached to the mask 61 to cause contamination. An inside of the light source chamber 10 is maintained at an ultra-low pressure of about 1.3 torr or less in order to prevent the generated extreme ultraviolet light B from being absorbed into the gas inside the light source chamber 10. In this regard, there is a limitation on removing the debris DD generated by the strong airflow. In an example embodiment, the suction unit 40 is disposed closely to the second focal point X2 to which the main pulse MP is irradiated, and the generated debris DD is suctioned before being scattered into the light source chamber 10 to be removed. Hereinafter, the suction unit 40 will be described in detail.

Referring to FIG. 2, the suction unit 40 may include a vacuum source 42 and an elongated suction compartment such as nozzle unit 41. The vacuum source 42 may provide a vacuum pressure lower than the pressure inside the light source chamber 10 to provide a flow AF1, which causes the gas inside the light source chamber 10 to be suctioned through the nozzle unit 41. In an example embodiment, the vacuum source 42 is configured to provide, and provides a differential pressure at least 0.4 torr lower than the pressure inside the light source chamber 10, for example, a differential pressure 0.4 torr to 1 torr lower than the pressure inside the light source chamber 10.

The nozzle unit 41, also described as a nozzle, may include a nozzle body 41B and a nozzle head 41H. The nozzle head 41H may be disposed to face the droplet discharge unit 22 and the nozzle body 41B may be disposed to protrude from the sidewall of the upper body 12. The nozzle body 41B may be disposed to extend lengthwise along a first axis AX1, which is the same axis/path as the first path DR of the droplet D. An item, layer, or portion of an item or layer described as extending "lengthwise" in a particular direction has a length in the particular direction and a width perpendicular to that direction, where the length is greater than the width. The nozzle body 41B may be symmetric (e.g., radially symmetric) with respect to the first axis AX1). The nozzle body 41B may have a circular or polygonal shape when viewed as a cross-section from the first axis AX1 direction. Accordingly, the debris DD suctioned through the nozzle head 41H proceeds along the first path DR, an original path, and can be easily moved to an inside of the nozzle body 41B. Depending on example embodiments, however, the nozzle body 41B may be disposed to face a direction other than the first axis AX1. The nozzle body 41B may include a portion of the nozzle having a straight outer surface in a lengthwise direction, and the nozzle head 41H may begin where the outer surface in the first axis AX1 direction begins to curve or narrow. The nozzle body 41B may have a width in a direction perpendicular to the first axis AX1 direction that is constant, whereas the nozzle head 41H has a width in the direction perpendicular to the first axis AX1 direction that changes in a non-linear manner. A length W7 of the nozzle body 41B may be modified according to the width W1 of the lower body 11 and a length W6 of the nozzle head 41H. A surface reflective layer RL2 is formed on an outer surface of the nozzle unit 41, such that the extreme ultraviolet light B reflected by the condensing mirror 11A can be reflected again off of the nozzle unit 41. The surface reflective layer RL2 may be formed of the same material as the reflective layer RL1 of the condensing mirror 11A. In one embodiment, the surface reflective layer RL2 may be formed of a multiple thin layers in which molybdenum-silicon (Mo—Si) are alternately stacked.

The nozzle head 41H may extend to the nozzle body 41B in a form in which the debris DD is easily sucked. In an example embodiment, the nozzle head 41H is exemplified as having a bell mouth shape, but is not limited thereto, and may be variously modified. For example, the nozzle body 41B may include a portion that has parallel sides, and the nozzle head 41H may have parallel sides where it connects to the nozzle body 41B, but may have narrowing sides extending therefrom and widening sides where it opens to an inside of the light source chamber 10. The nozzle head 41H may be radially symmetric with respect to the first axis AX1. A suction hole 411 of the nozzle head 41H may be disposed on the first path DR of the droplet D. The suction hole 411 may be provided to have a size such that if only the pre-pulse PP is irradiated on a droplet to form a droplet D2, the droplet D2 expanded into the pancake shape can be easily suctioned. In the case of an example embodiment, when an explosion speed of the droplet D is about 1000 m/s, and an explosion interval of the droplet D (e.g., a time interval between consecutive explosions based on consecutive droplets irradiated by the main pulse MP) is about 20 μs, the suction hole 411 has a width W8 of 0.5 mm to 20 mm. According to experimental results, at this speed and interval, when the width W8 of the suction hole 411 is less than 0.5 mm, the expanded droplet D2 may not be suctioned. When the width W8 of the suction hole 411 exceeds 20 mm, a cross-sectional area of the suction hole 411 may be too large to generate the pressure and the differential pressure inside the light source chamber 10.

An end 41E of the nozzle head 41H may be disposed in a position close to the second focal point X2 on the first path DR and not affecting the explosion of the droplet D. For example, the end 41E of the nozzle head 41H may be disposed closer to the second focal point X2 than it is to a side wall of the light source chamber 10, and may also be disposed closer to the first focal point X1 than it is to a side wall of the light source chamber 10. For example, in some embodiments, a distance between either of the first focal point X1 or second focal point X2 and the end 41E of the nozzle may be less than 20% of the distance between the end 41E of the nozzle and a sidewall of the upper body 12 of the light source chamber 10. In an example embodiment, according to experimental results, when the explosion speed of the droplet D is about 1000 m/s, and the explosion interval of the droplet D (e.g., between consecutive droplets) is about 20 μs or a distance or interval between consecutive droplets is about 1.4 mm, the end 41E of the nozzle head 41H may be spaced about by a distance W5 of 1.4 mm to 20 mm. When the distance W5 is less than 1.4 mm, the second focal point X2 is excessively close, and the droplet D may be affected by the explosion. When the distance W5 exceeds 20 mm, the distance from the second focal point X2 may be excessively distant, thereby lowering removal efficiency of the debris DD. The distance W4 between the first focal point X1 and the second focal point X2 may be the same as the distance W5, in some embodiments.

According to some embodiments, a length W6 of the nozzle head 41H may be two or more times but not more than four times the width W8 of the suction hole 411.

A heating unit H may be disposed in the nozzle body 41B and the nozzle head 41H. The heating unit H, also described as a heater, may be embedded in sidewalls of the nozzle body 41B and the nozzle head 41H, but is not limited thereto. The heating unit H may include, for example, heating elements such as heating coils embedded in the sidewalls of the nozzle body 41B and the nozzle head 41H, which heating elements heat up an inner sidewall surface of the sidewalls. At least part of the sidewalls of the nozzle body 41B and nozzle head 41H may be formed of a heat-transmissive material to transfer the heat to the inner sidewall surface. In some embodiments, the heating unit H may be disposed to cover outer surfaces of the nozzle body 41B and the nozzle head 41H, to cover sidewalls of the nozzle body 41B and the nozzle head 41H. The heating unit H may heat and melt solidified debris DD while being suctioned by the suction unit 40. The heating unit H may heat the nozzle body 41B and the nozzle head 41H at a temperature exceeding a melting point of the droplet D such that the debris DD is molten. In an example embodiment, the heating unit H may heat the debris DD at a temperature of about 232° C. to 400° C. at which tin is molten. The heating unit H may include some heat-insulative material on its outer surface, to avoid melting debris DD that may contact the surface reflective layer RL2.

Modified examples of the suction unit employed in an extreme ultraviolet light source system according to an example embodiment will be described with reference to FIGS. 5 to 8. FIGS. 5 to 8 are diagrams illustrating modified example of a suction unit employed in an extreme ultraviolet light source system according to an example embodiment.

Figure 5:
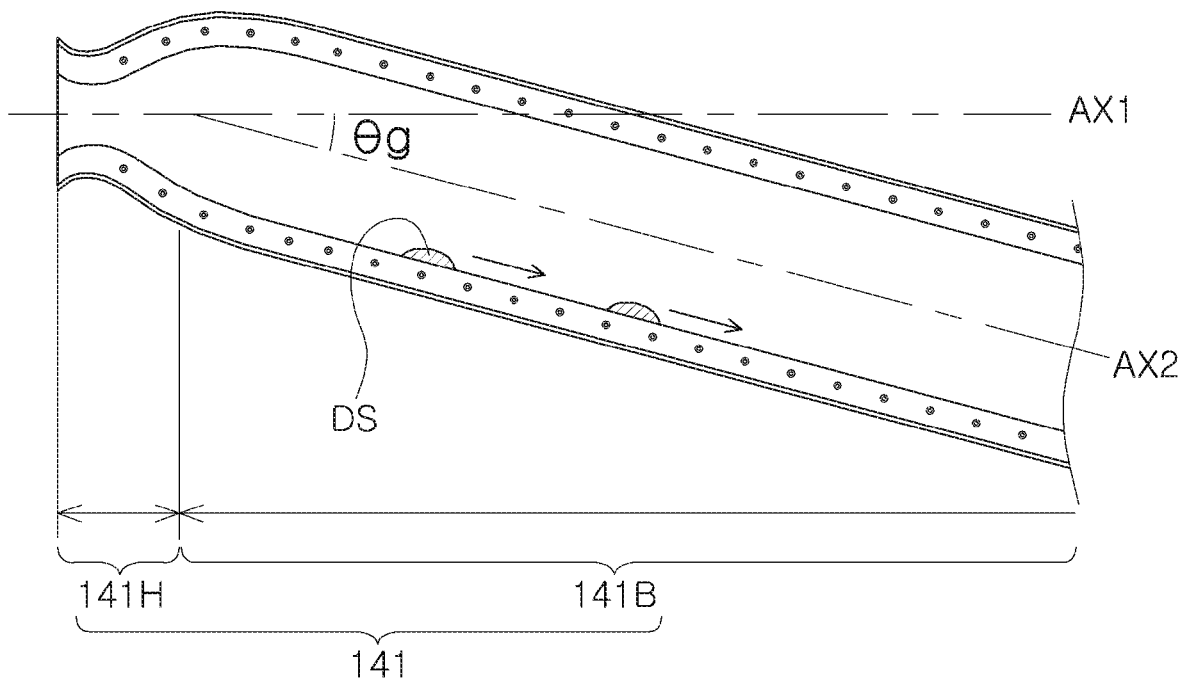
FIGS. 5, 6, 7A, 7B, and 8 are diagrams illustrating modified examples of a suction unit employed in an extreme ultraviolet light source system according to an example embodiment.

As compared to the above described example embodiments, the modified example of FIG. 5 has a difference in that a shape of the nozzle body 141B with respect to the nozzle head 141H is modified. With reference to FIG. 5, a nozzle head 141H of a nozzle unit 141 is disposed to extend in a direction of a first axis AX1, to be symmetrical (e.g., radially symmetric) with respect to the first axis AX1. A nozzle body 141B of the nozzle unit 141 is disposed to extend lengthwise in a direction of a second axis AX2, downwardly inclined (in a direction from inside the light source chamber 10 toward a wall of the upper body 12 of the light source chamber 10) at a predetermined inclination angle θg, with respect to the first axis AX1. A portion of the upper wall of the nozzle body 141B at an interface between the nozzle body 141B and the nozzle head 141H may have an additional amount of curvature. The nozzle head 141H according to an example embodiment is illustrated as having a bell mouth shape, but is not limited thereto, and may be variously modified.

The predetermined inclination angle θg may be 20° or more, for example, 20° to 45°. The nozzle body 141B is disposed to be downwardly inclined, such that debris DS molten by a heating unit H can naturally flow along the nozzle body 141B by gravity. When the nozzle body 141B is inclined at an angle of less than 20°, the molten debris DS may remain attached to the nozzle body 141B, thereby making it difficult for the molten debris to flow into the nozzle body 141H. For example, when the molten debris DS has a hemispherical shape with a diameter of 20 mm, surface tension by gravity is 560 dyn/cm. In this regard, when the nozzle body 141H is inclined by an angle less than 20°, it may be difficult for the molten debris DS to flow along a surface of the nozzle body 141H.

Figure 6:
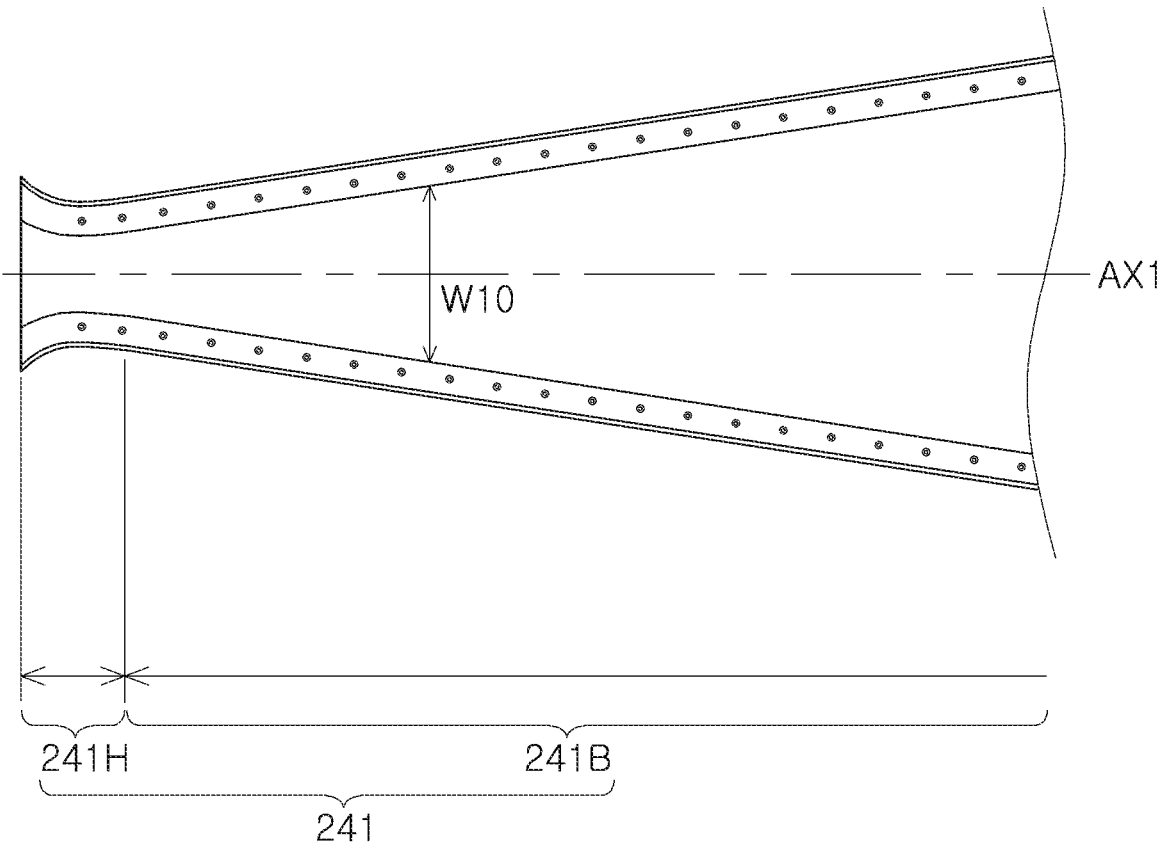

As compared to the above described example embodiments, the modified example of FIG. 6 has a difference in that a shape of the nozzle body 241B is modified. Referring to FIG. 6, a nozzle body 241B of the nozzle unit 241 may have a conical or polygonal pyramid shape having a gradually increasing cross-sectional area W10. In this case, eddy flow occurring at a rear end of the nozzle head 241H may be prevented to stably maintain a flow of suctioned airflow. The nozzle head 141H according to an example embodiment is illustrated as having a bell mouth shape, but is not limited thereto, and may be variously modified. As shown in FIG. 6, the nozzle body 141B may include a portion of the nozzle having a straight outer surface in a lengthwise direction, and the nozzle head 141H may begin where the outer surface in the first axis AX1 direction begins to curve. The nozzle body 141B may have a width (or cross-sectional area W10) in a direction perpendicular to the first axis AX1 direction that changes linearly, whereas the nozzle head 141H has a width in the direction perpendicular to the first axis AX1 direction that changes in a non-linear manner.

Figure 4:
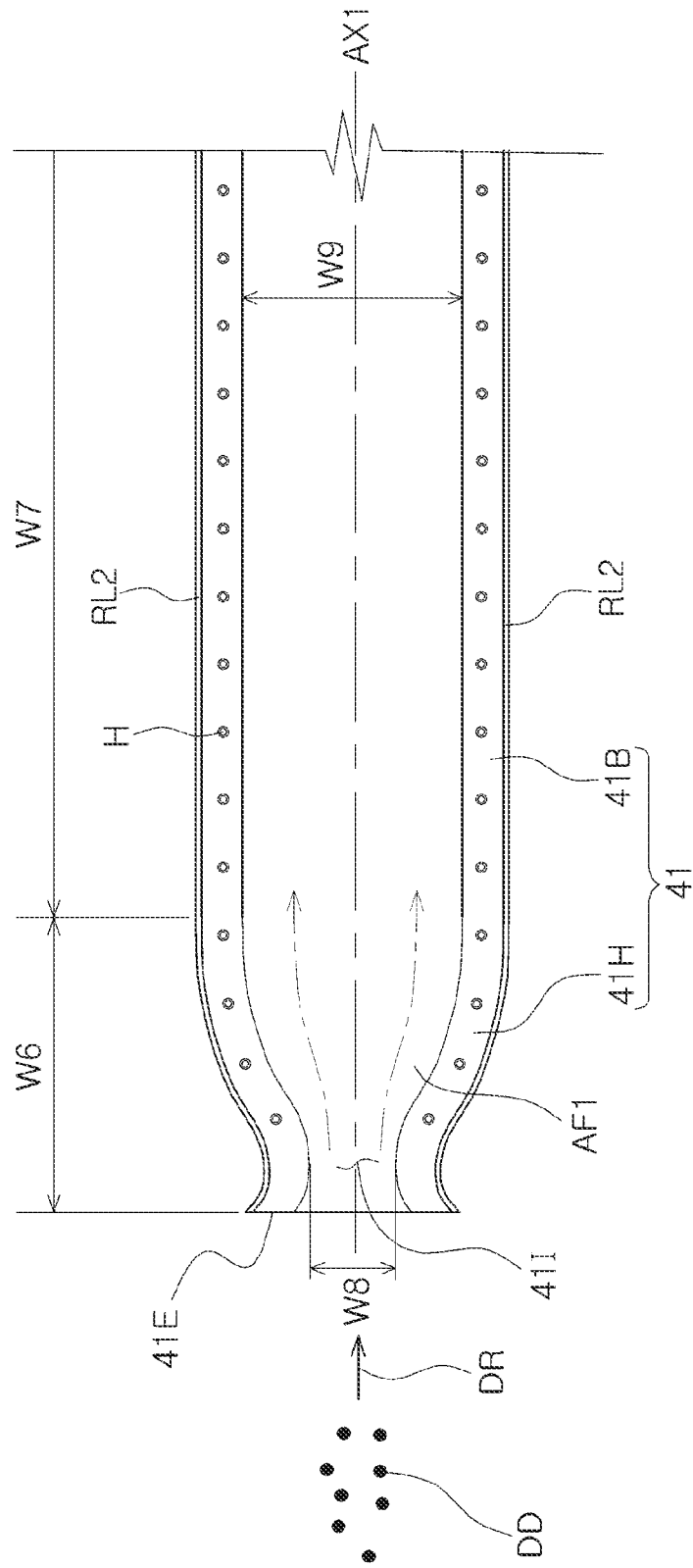
FIG. 4 is an enlarged view of a nozzle portion of FIG. 3, according to an example embodiment.

The example embodiments of FIGS. 4-6 are described in connection with a nozzle unit, described as having a nozzle head and nozzle body. The structure of FIGS. 4-6 can also be described as a tube structure, having a body portion and a mouth portion, where the body portion may have an elongated cylindrical or conical shape, and the mouth may have a narrowing and then widening portion.

Figure 7A:
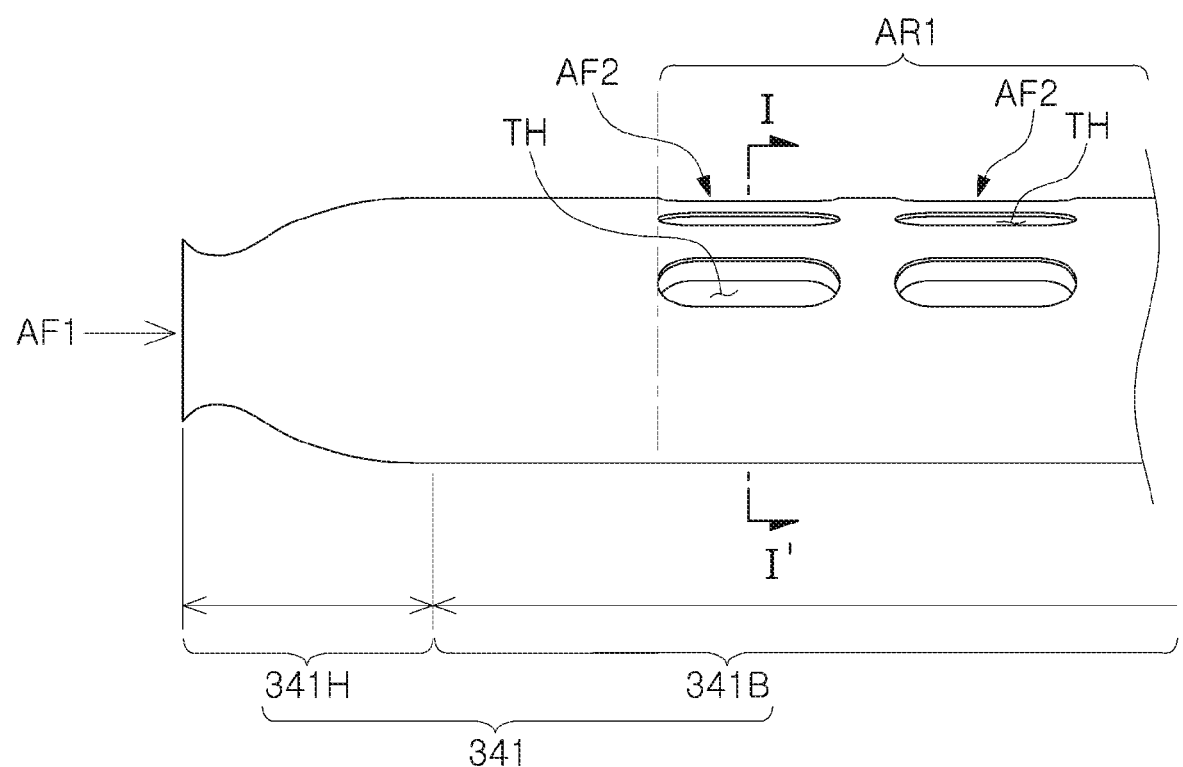
Figure 7B:
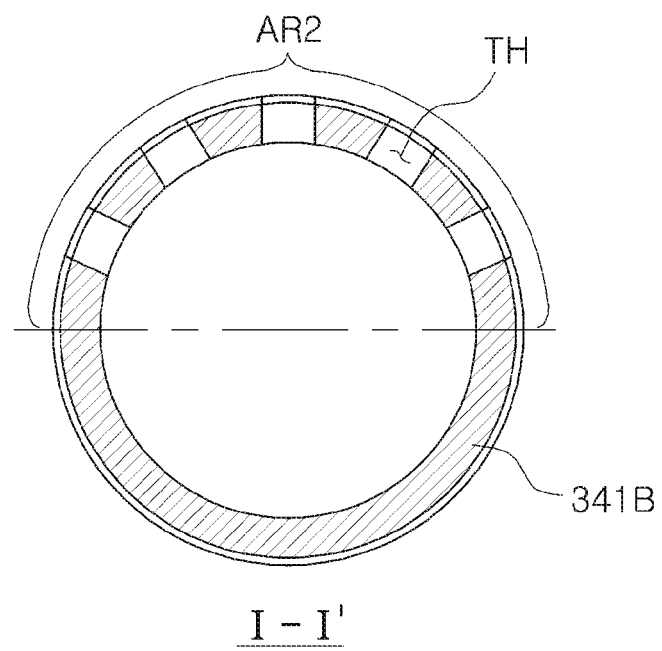

As compared to the above described example embodiments, the modified examples of FIGS. 7A and 7B are different in that a through-hole TH or plurality of through-holes TH are further formed in a nozzle body 341B. FIG. 7A is a diagram illustrating an exterior of the nozzle unit 341, while FIG. 7B is a cross-sectional view taken along I-I' of FIG. 7A. Through-holes TH such as shown in FIGS. 7A and 7B can be used in any of the aforementioned embodiments of the nozzle unit, such as nozzle unit 41 shown in FIG. 4, nozzle unit 141 shown in FIG. 5, or nozzle unit 142 shown in FIG. 6. Thus, the features of FIGS. 7A and 7B combined with FIG. 4 (e.g., including the heating unit) is one embodiment, the features of FIGS. 7A and 7B combined with FIG. 5 (e.g., including the heating unit) is another embodiment, and the features of FIGS. 7A and 7B with FIG. 6 (e.g., including the heating unit) is another embodiment.

Referring to FIG. 7A, the through-hole TH may be formed in one area AR1 of the nozzle body 341B of the nozzle unit 341. The one area AR1 may be an area adjacent to a sidewall of the light source chamber 10 (see FIG. 2). Accordingly, a flow AF2 which gas stagnated in the area adjacent to the sidewall of the light source chamber 10 is suctioned through the through-hole TH may be formed. Referring to FIG. 7B, the through-hole TH may be limitedly disposed on an upper surface AR2 of the nozzle body 341B facing an upper portion of the light source chamber 10, such that no through-holes are formed on a lower surface of the nozzle body 341B facing a lower portion of the light source chamber 10. The through-hole TH may extend in a lengthwise, or longitudinal direction of the nozzle body 341B.

Figure 8:
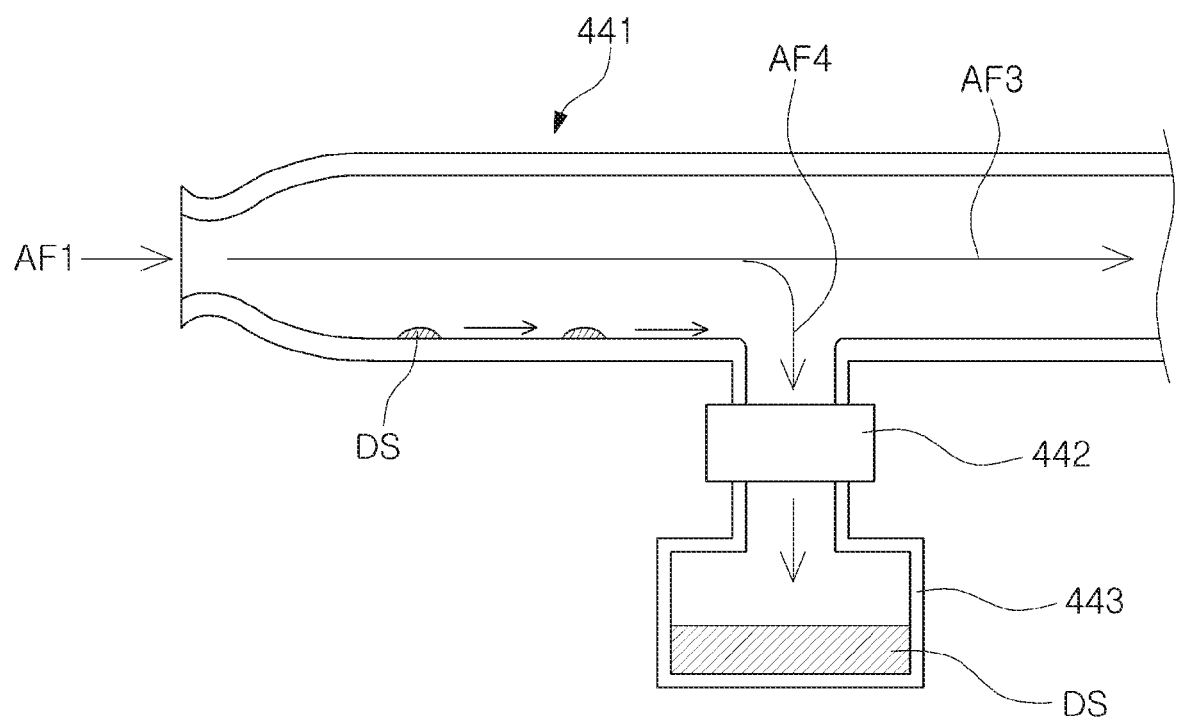

As compared to the above described example embodiments, the modified examples of FIG. 8 is different in that a storage unit 443, in which molten debris DS is stored, is further disposed in a nozzle unit 441. The storage unit 443 may be a receptacle or storage bin, for example. Referring to FIG. 8, the storage unit 443, in which molten debris DS is stored, is disposed in one area of the nozzle unit 441 such that a flow AF1 of gas introduced through an end of the nozzle unit 441 passes a region in which the storage unit 443 is located while allowing only the molten debris DS to be accumulated in the storage unit 443. Accordingly, a flow AF3 of gas passing through the storage unit 443 may be kept constant. The storage unit 443 may be coupled to the nozzle unit 441 in a detachable structure. Therefore, when the storage unit 443 is filled with the debris DS, a flow AF4 of gas flowing to the storage unit 443 is blocked by closing a valve 442, followed by separating the storage unit 443 therefrom. This may enable easy disposal of the debris DS accumulated in the storage unit 443. The storage unit 443 and valve 442 of FIG. 8 can be included in any of the examples shown in FIGS. 4-6 and 7A and 7B, such that a single embodiment includes all of the combined features. For example, one embodiment can include the angled nozzle unit 141 labeled in FIG. 5 including a heating unit H labeled in FIG. 4, through-holes TH shown in FIGS. 7A and 7B, and the storage unit 443 and valve 442 shown in FIG. 8.

The extreme ultraviolet light source system SO having a configuration such as described in the examples above is disposed with the suction unit 40 such that the main pulse MP is irradiated on the droplet D at the second focal point X2, which is adjacent to an end of the suction unit 40, and the debris DD can be suctioned by the nozzle pneumatically. Accordingly, the debris DD contaminating an internal space of the light source chamber 10 or the mask 61 (see FIG. 1) can be preemptively removed before scattering.

Figure 9A:
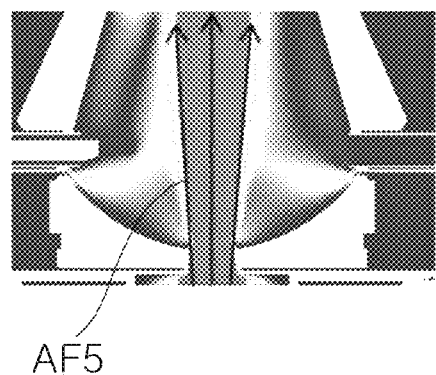
FIGS. 9A and 9B are diagrams illustrating simulations of airflow inside a chamber of a comparative example and an example embodiment of the present disclosure.
Figure 9B:
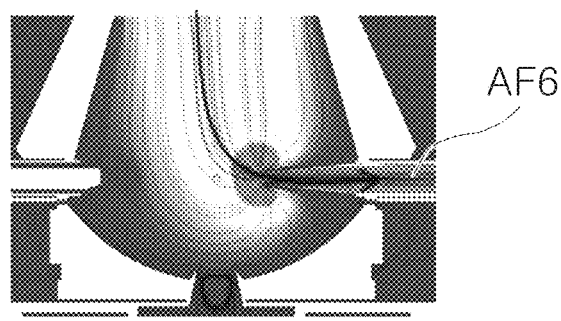

FIGS. 9A and 9B are diagrams illustrating simulations of airflow inside a chamber of a comparative example and an example embodiment of the present disclosure. FIG. 9A is a comparative example illustrating a flow of airflow AF5 in a light source chamber 10 when a suction unit is not disposed, while FIG. 9(b) illustrates a flow AF6 of airflow inside a light source chamber 10 according to an example embodiment's experimental results.

In the case of the comparative example, it can be seen that by a strong rising airflow formed by a laser oscillated from a light source unit 30, an airflow inside the light source chamber 10 has a flow AF5 flowing upwardly as a whole. In this case, debris DD may contaminate an internal space of the light source chamber 10 or the mask.

In contrast, in the case of an example embodiment, a flow AF6 which the airflow inside a light source chamber 10 as a whole flows toward a suction unit 40 is generated. Accordingly, debris DD may be removed before scattering into an internal space of a light source chamber 10.

As a result of measuring an amount of debris DD remaining inside the light source chamber 10, 1594 debris particles per unit area were measured to be present in the case of the comparative example, while 409 debris particles per unit area were measured to be present in the one example embodiment's experimental results. Accordingly, it can be seen that a number of the debris DD particles remaining in the light source chamber 10 is reduced by 74.3% as compared to that of the comparative example.

Figure 10:
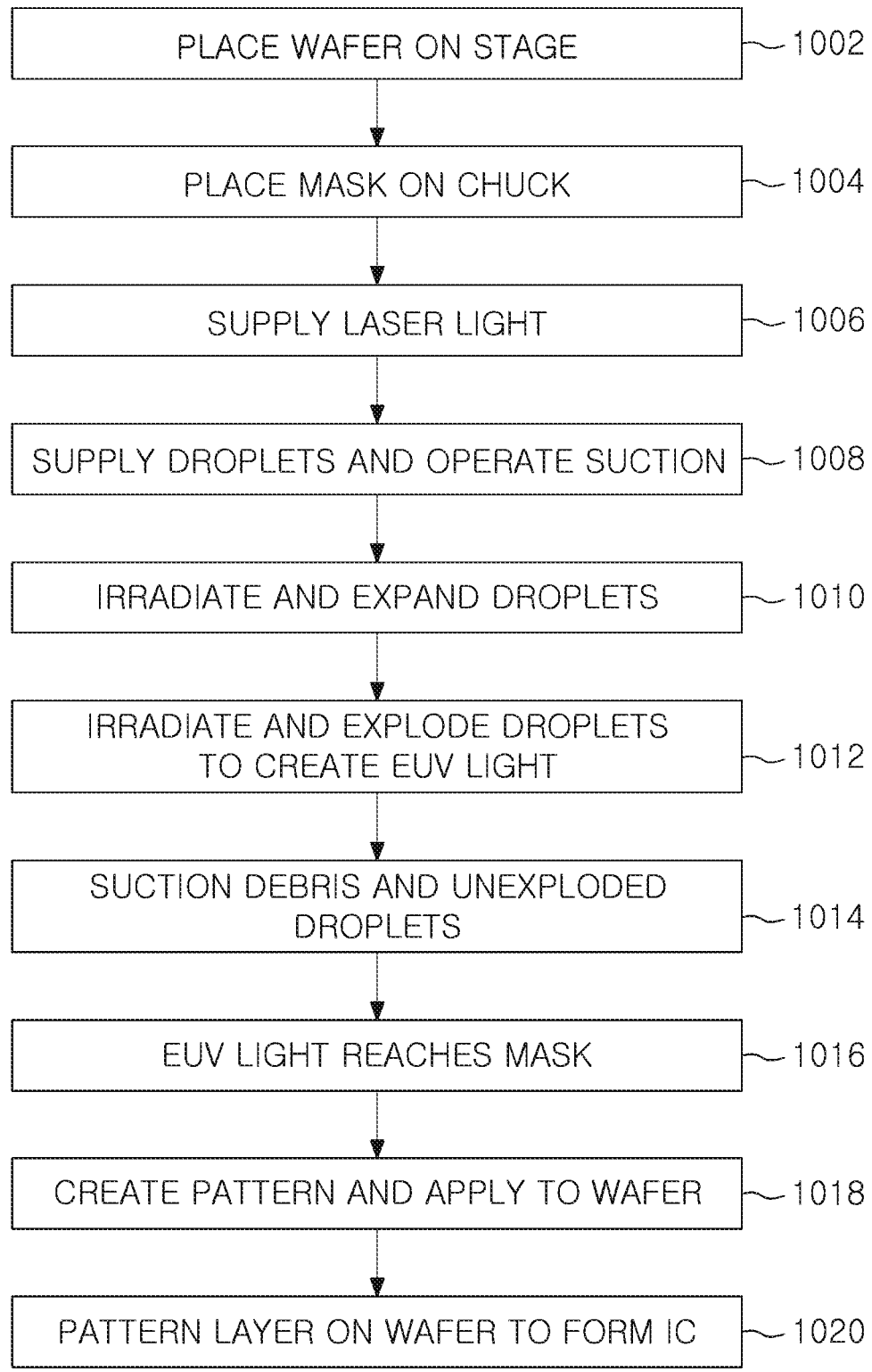
FIG. 10 is a flow chart showing a method of manufacturing a semiconductor device using extreme ultraviolet exposure equipment, according to some embodiments.

FIG. 10 is a flow chart describing a method of manufacturing a semiconductor device using extreme ultraviolet exposure equipment such as described in FIGS. 1-6, 7A, 7B, and 8.

In step 1002, a wafer, such as substrate W, is placed on a stage, such as lower electrostatic chuck 70 shown in FIG. 1. The wafer may be, for example, a semiconductor substrate having one or more insulation or conductive layers formed thereon, from which patterns are to be formed.

In step 1004, which may occur at the same time, before, or after step 1002, a mask, such as mask 61, is placed on an upper electrostatic chuck (e.g., 62), as shown in FIG. 1. The mask may have a certain pattern formed thereon, to be transferred to the wafer, using extreme ultraviolet light.

In step 1006, a light generator of an EUV light source supplies a light, such as a laser light to a chamber. The light may be supplied to two focal points within a light source chamber, such as first focal point X1 and second focal point X2 of light source chamber 10. The light may be supplied using light source unit 30, in the manner described previously.

In step 1008, droplets of material, such as tin (Sn), are supplied to the light source chamber along a first path that crosses the first focal point X1 and second focal point X2. At the same time, a suction unit such as suction unit 40 is operated. For example, a vacuum source 42 may be turned on to supply a vacuum pressure lower than the pressure inside the light source chamber 10 (e.g., by at least 0.4 torr). An end of a suction tube, such as a nozzle, is positioned to be adjacent to the second focal point (e.g., about 1.4 mm to 20 mm away), along the first path.

In step 1010, the droplets are irradiated by the laser light (e.g., a pre-pulse PP) reaching the first focal point, which expands and changes the shape of the droplets. In step 1012, the expanded droplets are irradiated by the laser light (e.g., a main pulse MP) reaching the second focal point, which explodes the droplets, creating an EUV plasma (e.g., P), as well as debris (e.g., DD).

In step 1014, due to the suction created by the vacuum source 42, the debris DD as well as in some cases unexploded expanded droplets are suctioned into the suction tube (e.g., nozzle). Steps 1006, 1008, 1010, 1012, and 1014 may occur simultaneously. Some of the droplets and debris suctioned into the suction tube may be melted and may also be stored in a receptacle, as described previously in connection with various embodiments.

In step 1016, the EUV light generated from the EUV plasma exits the light source chamber, where it is reflected by various mirrors and eventually reaches a mask, such as mask 61. The mask creates a pattern in the light, which patterned light is then passed through more mirrors and to a surface of the wafer (step 1018). The light then patterns a layer at a surface of the wafer (step 1020), which pattern is used to form part of an integrated circuit of the wafer. Steps 1016, 1018, and 1020 may occur at the same time as steps 1006, 1008, 1010, 1012, and 1014.

As set forth above, an extreme ultraviolet light source system in which an inner space of a chamber or a mask is prevented from being contaminated by a droplet debris can be provided.

Various advantages and beneficial effects of the present disclosure are not limited to the foregoing, as will be readily understood in the course of describing the specific embodiments of the present disclosure.

While example embodiments have been shown and described above, it will be apparent to those skilled in the art that modifications and variations could be made without departing from the scope of the present invention as defined by the appended claims.

What is claimed is:

1. An extreme ultraviolet light source system, comprising:
a chamber configured to maintain a pressure of an inner space thereof at a first pressure;
a droplet supply unit disposed in the chamber and configured to discharge a droplet on a first path;
a light source configured to emit a light for generating plasma by irradiating a laser light to the droplet at a focal point on the first path; and
a suction unit disposed on the first path so as to face the droplet supply unit in the chamber and configured to suction debris of the droplet irradiated with the laser light at a second pressure, lower than the first pressure,
wherein the suction unit comprises a nozzle protruding from a side wall of the chamber toward the focal point, and an end of the nozzle is closer to the focal point than it is to the side wall of the chamber.

2. The extreme ultraviolet light source system of claim 1, wherein the light for generating plasma comprises a pre-pulse and a main pulse of irradiated laser light,
the focal point comprises a first focal point at which the pre-pulse is focused and the light source is configured to irradiate the main pulse at a second focal point at which the main pulse is focused, and
the end of the nozzle is spaced apart from the second focal point by 1.4 mm to 20 mm.

3. The extreme ultraviolet light source system of claim 1, wherein the end of the nozzle is disposed on the first path and comprises a suction unit having a width of 0.5 mm to 20 mm.

4. The extreme ultraviolet light source system of claim 1, wherein the droplet is one of a plurality of droplets, and
wherein the droplet supply unit is configured to discharge the plurality of droplets with an interval of 1.4 mm or more between droplets on the first path.

5. The extreme ultraviolet light source system of claim 1, wherein the suction unit further comprises a heating unit surrounding a sidewall of the nozzle or embedded within a sidewall of the nozzle.

6. The extreme ultraviolet light source system of claim 5, wherein the heating unit is configured to heat an inner sidewall surface of the nozzle to a temperature equal to or higher than a melting temperature of the droplet.

7. The extreme ultraviolet light source system of claim 6, wherein the droplet is formed of tin (Sn), and
the heating unit is configured to heat the inner sidewall surface to a temperature of 232° C. to 400° C.

8. The extreme ultraviolet light source system of claim 6, wherein the nozzle is disposed in the chamber to be downwardly inclined with respect to the first path in a direction from the focal point to the side wall of the chamber.

9. The extreme ultraviolet light source system of claim 1, wherein one or more through-holes are disposed in a region of a sidewall of the nozzle adjacent to the side wall of the chamber.

10. The extreme ultraviolet light source system of claim 9, wherein the one or more through-holes are disposed only on an upper surface of the nozzle facing an upper portion of the chamber, and no through-holes are disposed on a lower surface of the nozzle facing a lower portion of the chamber.

11. The extreme ultraviolet light source system of claim 9, wherein each of the one or more through-holes extends in a longitudinal direction of the nozzle.

12. The extreme ultraviolet light source system of claim 1, wherein a storage unit for accumulating the debris suctioned from the suction unit is attached to the suction unit.

13. The extreme ultraviolet light source system of claim 12, wherein the storage unit is detachably coupled to the nozzle.

14. The extreme ultraviolet light source system of claim 1, wherein the nozzle has an increasing cross-sectional area in a direction toward the side wall of the chamber from the focal point.

15. The extreme ultraviolet light source system of claim 14, wherein the chamber comprises:
a lower body comprising a concave condensing mirror; and
an upper body covering the lower body and having a conical shape.

16. The extreme ultraviolet light source system of claim 1, further being disposed with a reflective layer covering an external surface of the nozzle.

17. The extreme ultraviolet light source system of claim 16, wherein the reflective layer is formed of multiple thin layers on which molybdenum-silicon (Mo-Si) are alternately stacked.

18. An extreme ultraviolet light source system comprising:
a chamber;
a droplet supply unit disposed in the chamber and arranged to discharge a droplet along a first path crossing an internal space of the chamber;
a laser light source configured to irradiate a laser to the droplet at a focal point on the first path; and
a suction unit disposed in the chamber so as to face the droplet supply unit on the first path, having an end spaced apart from the focal point by 1.4 mm to 20 mm, and configured to suction debris of the droplet at a pressure lower than a pressure of the chamber.

19. An extreme ultraviolet light source system, comprising:
a chamber comprising a condensing mirror;
a droplet supply unit disposed on a first side wall of the chamber and arranged to discharge a droplet along a first path, the first path extending above the condensing mirror;
a laser light source configured to irradiate a laser to the droplet at a first focal point on the first path; and
a suction unit including a nozzle disposed on a second side wall of the chamber opposite the first side wall, so as to face the droplet supply unit on the first path, the nozzle protruding to be adjacent to the first focal point, and configured to suction debris of the droplet at a differential pressure at least 0.4 torr lower than a pressure of the chamber.

20. The extreme ultraviolet light source system of claim 19, further comprising a surface reflective layer covering an external surface of the nozzle,
wherein the surface reflective layer is formed of a material that also forms a surface of the condensing mirror.

* * * * *